United States Patent [19]

Harris et al.

[11] 4,315,255
[45] Feb. 9, 1982

[54] MULTIPLE-QUANTUM INTERFERENCE SUPERCONDUCTING ANALOG-TO-DIGITAL CONVERTER

[75] Inventors: Richard E. Harris; Clark A. Hamilton, both of Boulder, Colo.

[73] Assignee: The United States of America as represented by the Secretary of the Navy, Washington, D.C.

[21] Appl. No.: 201,669

[22] Filed: Oct. 27, 1980

[51] Int. Cl.³ .......................................... H03K 13/02
[52] U.S. Cl. ............................ 340/347 AD; 307/306
[58] Field of Search .............. 340/347 M, 347 AD; 307/277, 306, 245; 338/325

[56] References Cited
U.S. PATENT DOCUMENTS 3,949,395 4/1976 Klein ..................... 340/347 AD

OTHER PUBLICATIONS

Fang "IBM Technical Disclosure Bulletin" vol. 17, No. 8, Jan. 1975, pp. 2476-2478.
Anacker "IBM Technical Disclosure Bulletin" vol. 17, No. 4, Sep. 1974, pp. 1237-1237A.
Zappe "IBM Technical Disclosure Bulletin" vol. 17, No. 10, Mar. 1975, pp. 3053-3054.

Primary Examiner—Charles D. Miller
Attorney, Agent, or Firm—Richard S. Sciascia; Thomas M. Phillips

[57] ABSTRACT

An analog-to-digital converter using superconducting interferometers connected in parallel, each interferometer being identical. The coupling of the analog signal to each successive interferometer is increased in the ratio of 1:2:4:8:16:32:, etc. The application of a pulsed power supply to the parallel connected interferometer generates output voltages on the interferometers. The output voltages are a Gray Code representation of the analog signal.

3 Claims, 8 Drawing Figures

MULTIPLE-QUANTUM INTERFERENCE SUPERCONDUCTING ANALOG-TO-DIGITAL CONVERTER

BACKGROUND OF THE INVENTION

The invention is in the field of analog-to-digital converters and more particularly is an analog-to-dogital converter using Josephson devices connected as superconducting interferometers.

Devices which exhibit the Josephson effect are known and such devices have been disclosed as being useful for switching functions. Such devices are cryogenic and have an I-V characteristic which allows them to perform switching functions. The voltage across a device is $V=0$ for gating currents up to $I_m$, the critical current. At $I_m$ the voltage jumps to $V=(2\Delta/e)\neq 0$ where $\Delta$ is the superconducting energy gap. The critical current also varies with magnetic field applied to the Josephson device. The magnetic field is typically applied by means of a control current flowing through a control line overlapping the Josephson device. The critical current, $I_m$, versus the control current, $I_c$, is known as the gain curve of the device. A Josephson device can be made to switch from the $V=0$ to the $V=(2\Delta/e)$ state by varying the control current $I_c$. For example, if a control current of $I_{c1}$ and a gate current of $I_{g1}$ are applied, and if $I_{c1}$ causes $I_{m1}$ to be above $I_{g1}$, the device will be in the $V=0$ state. If the control current is changed to $I_{c2}$, which causes $I_{m2}$ to be less than $I_{g1}$, and $I_{g1}$ is again applied as the gate current, the device will switch to $V=2\Delta$ state. This is shown in FIG. 1b. An Analog-To-Digital Converter Using Josephson Junctions is disclosed by H. H. Zappe to IBM technical disclosure bulletin Vol. 17, no. 10, March 1975. The Zappe device suffers from the difficulty of achieving binary sensitivity ratios due to the use of variable inductance interferometers. Also the Zappe device produces binary output code and leads to large errors in the output due to imperfect alignment of the threshold values.

SUMMARY OF THE INVENTION

Applicant provides an analog-to-digital converter that uses a set of superconducting interferometers which operate as current comparators. Each of these interferometers may consist of two or more Josephson junctions connected in superconducting loops. An N number of the superconducting interferometers are connected through regulating resistors to a common power supply, each interferometer being identical. The coupling of the control signal to each successive interferometer is increased in the ratio of 1:2:4:8:16:32:, etc. A pulsed power supply is applied across the parallel connected interferometers. When an analog signal is applied to the control line, a control current proportional to the analog signal will cause either a 1 or 0 level output to occur at each of the N interferometers. These digital levels are a Gray Code representation of the signal.

Accordingly, an object of the invention is the provision of an analog-to-digital converter using identical superconducting interferometers.

Another object of the invention is the provision of a superconducting analog-to-digital converter that provides a Gray Code digital output.

Other objects, advantages and novel features of the invention will become apparent from the following detailed description of the invention when considered in conjunction with the accompanied drawings wherein:

FIGS. 1a–1d are the circuit diagram of a superconducting interferometer, the I-V curve, the gain curve, and the input/output curve associated therewith.

Figure 1A:
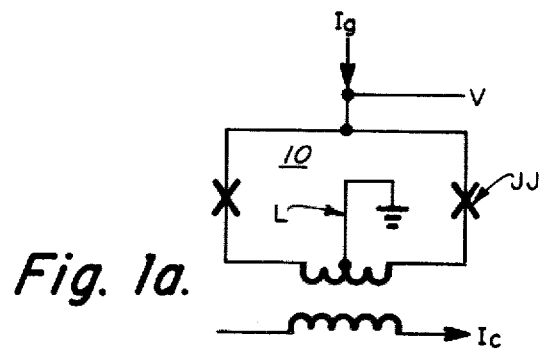
Figure 1D:
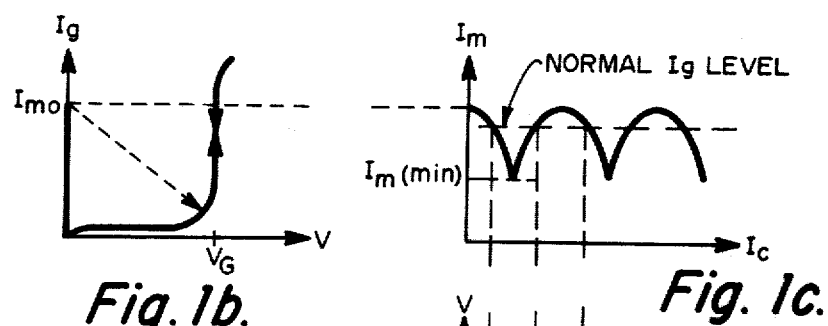
Figure 1D:
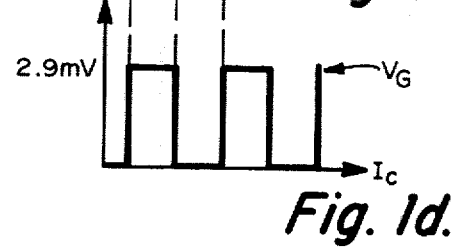

Referring now to the drawings wherein there is shown in FIG. 1a a circuit for a 2-junction interferometer 10 with its I-V curve in FIG. 1b. FIG. 1b shows that a current can flow through the device with zero voltage drop. The maximum value of this zero voltage current is denoted by $I_{mo}$. For currents below the maximum threshold current, $I_{mo}$, the device has zero voltage drop. When $I_{mo}$ is exceeded the interferometer switches very rapidly (10–30 ps) along the load line to the energy gap voltage ($V_G\simeq 2.9$ mV). As shown in FIGS. 1b–1d, the threshold current $I_m$ has a maximum value $I_{mo}$ and a periodic dependence on the control current $I_c$, which may be magnetically coupled to or directly injected into interferometer 10. As shown in FIG. 1d, comparator 10 has the unique property that it has a digital output, V, that is a periodic function of the analog signal input, $I_c$. This is the property required for an analog-to-digital converter since each output of an analog-to-digital converter is a periodic function of the signal input with the period changing by a factor of 2 from one bit to the next.

Figure 2:
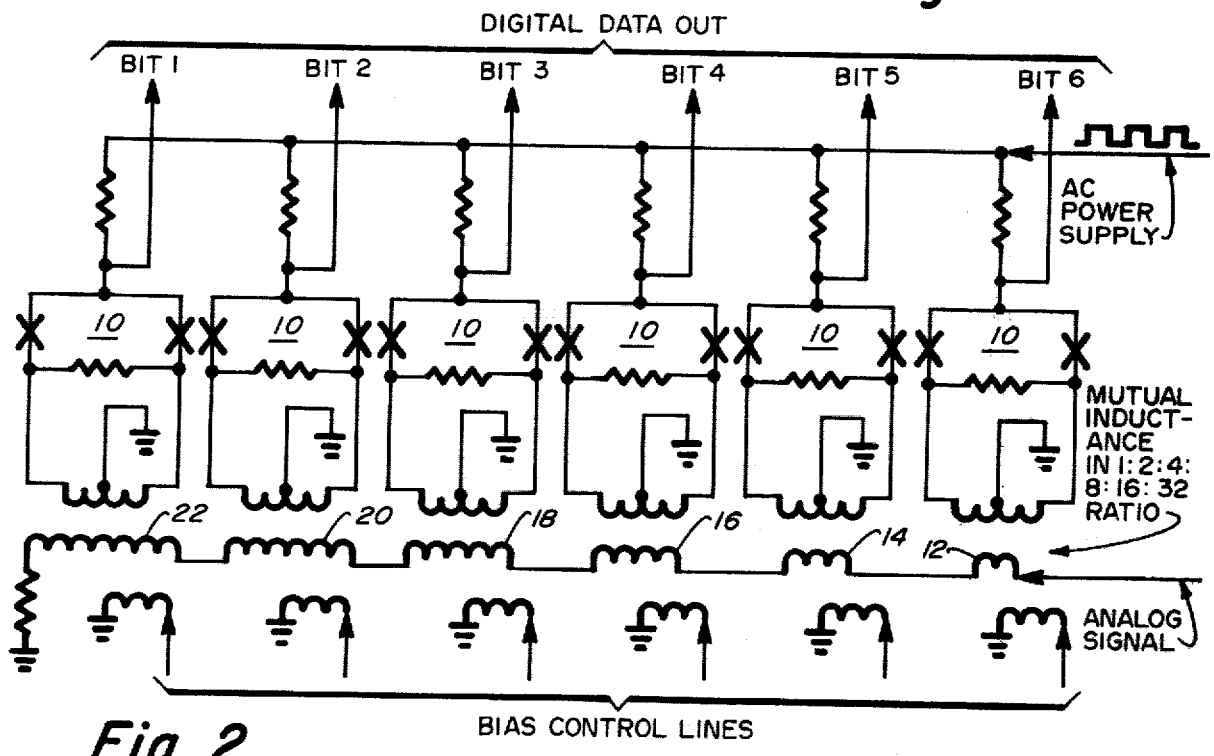
FIG. 2 is a schematic diagram of a preferred embodiment of the invention.
Figure 3:
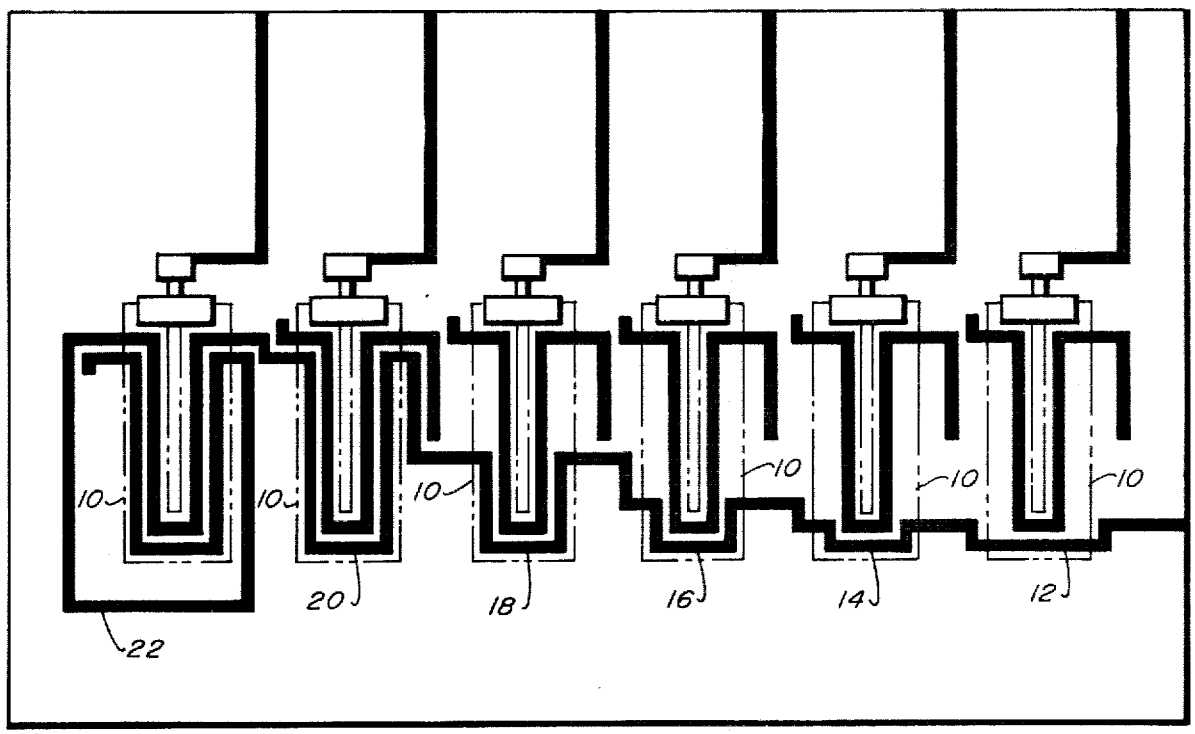
FIG. 3 is a partial integrated circuit layout which shows the geometry of the signal control line of the embodiment of FIG. 1.

In FIG. 2 an analog-to-digital converter embodying the invention is shown having a plurality of interferometers 10 (in this case, six) connected in parallel. In this embodiment, the analog signal input is inductively coupled to control interferometers 10 by means of the signal line segment which passes over each interferometer. The signal line segments are shown schematically in FIG. 2 as inductances 12, 14, 16, 18, 20 and 22. The mutual inductance of control line segments 12, 14, 16, 18, 20 and 22 is chosen to provide a factor of two increases in the mutual inductance between the control signal line segment and each successive interferometer 10 (1:2:4:8:16:32, etc). The desired mutual inductance ratios are achieved by varying the length of signal line which passes over each interferometer. This is shown in FIG. 3 which is the partial integrated circuit layout of the device. As shown, the lengths vary from a small fraction of a turn 12 (most significant bit) to two full turns 22 (least significant bit).

Figure 4:
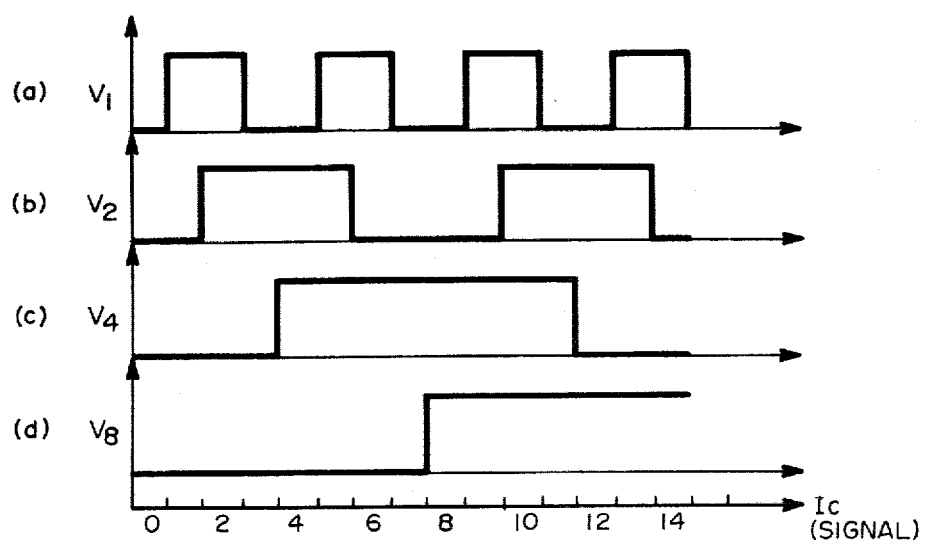
FIG. 4 is a set of curves of output voltage as function of control current for 4 interferometers with control current coupling in the ratio 1:2:4:8 (top to bottom)

Using the multiple lobes of the pattern in FIG. 1c and referring to FIG. 4 determination of any one bit occurs as follows: The analog signal is applied continuously to the control line causing the control current to vary along the $I_c$ axis. At the sample time, a current pulse, $I_g$, is applied to the power supply line so that all interferometers are biased to the level shown in FIG. 1b. Each interferometer for which this bias level exceeds the threshold curve will switch to the voltage state producing a 2.9 mV pulse on its output line. These pulses are a digital representation of the analog signal.

Figure 5:
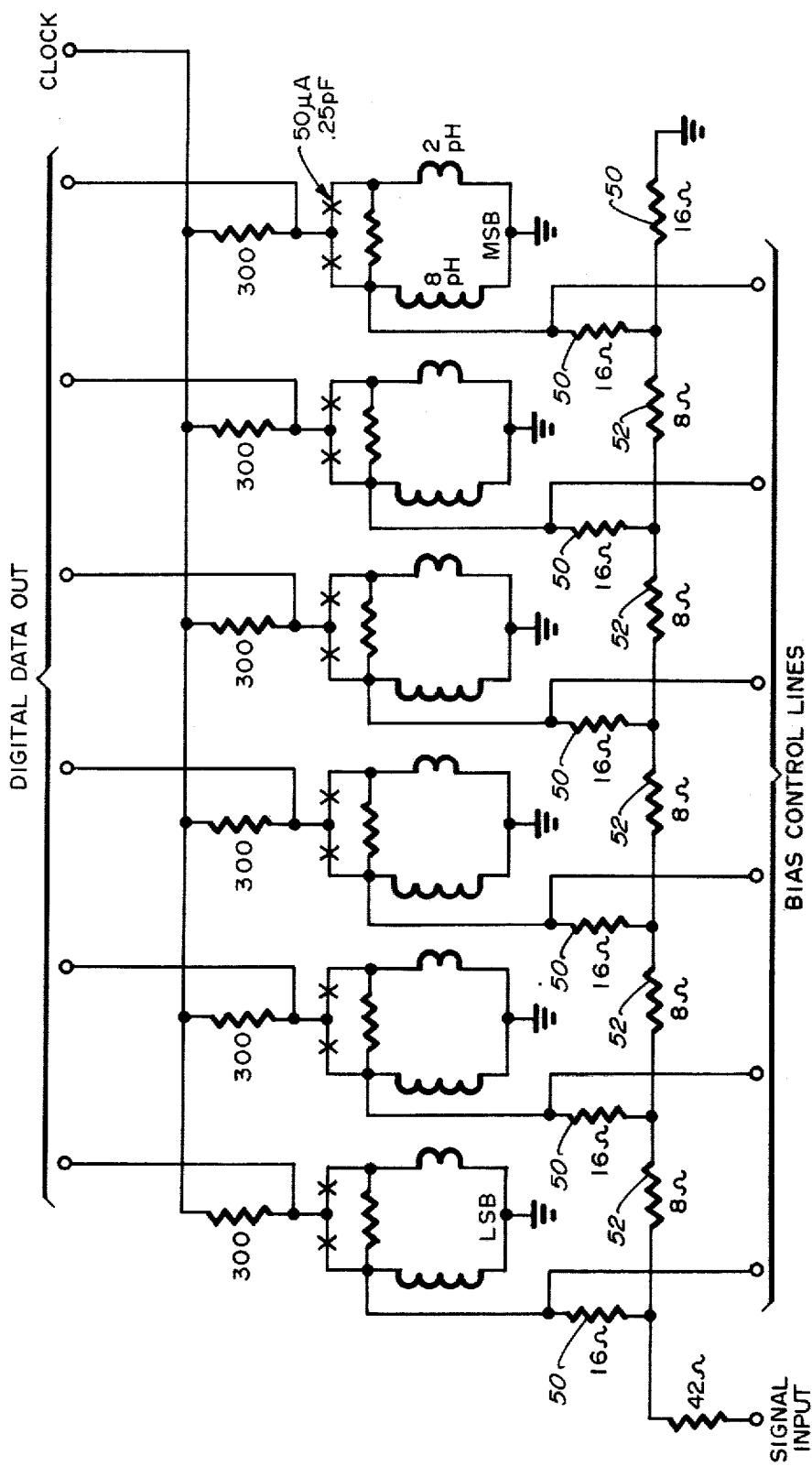
FIG. 5 is a schematic diagram of a modification of the embodiment of FIG. 1 using direct injection of the analog signal.

In the embodiment shown in FIG. 5, the analog input signal is directly injected into the interferometers by means of a resistor ladder. The resistor ladder is composed of resistors 50 and 52 and is used to divide the input signal in a binary sequence. Each signal component is then injected asymetrically through the interferometers so that the injected current flows through about 80% of the total inductance. The full scale sensitivity for the direct injection of FIG. 5 is 8.3 mA as compared to 3.5 mA for the magnetic coupling embodiment of FIG. 2. The use of identical interferometers and the symmetry of the resistor ladder assures the desired binary coupling ratios independent of processing parameters.

Obviously many modifications and variations of the present invention are possible in the light of the above teachings. It is therefore to be understood that within the scope of the appended claims the invention may be practiced otherwise than as specifically described.

We claim:

1. An analog-to-digital converter comprising:
   a plurality of superconducting inteferometers connected in parallel,
   each of said interferometers comprising at least two Josephson junctions connected in a superconducting loop,
   circuit means for coupling an analog signal as the control current to each of said interferometers with factor of two changes in coupling to each successive interferometer,
   each of said interferometers having an inductance means for coupling the input analog signal to said interferometers, and
   circuit means for connecting a gating voltage across said parallel connected interferometers for biasing all of said interferometers, whereby each interferometer for which the bias level exceeds its threshold level will switch from a zero voltage to a voltage state producing an output pulse.

2. The analog-to-digital converter of claim 1 wherein said inductance means is a control line of different lengths connected in series to achieve the factor of two changes of the mutual inductance between the common analog signal line and each successive interferometer.

3. An analog-to-digital converter comprising:
   a plurality of superconducting interferometers connected in parallel,
   each of said interferometers comprising at least two Josephson junctions connected in a superconducting loop,
   circuit means for coupling an analog signal as the control current to each of said interferometers with factor of two changes in coupling to each successive interferometer,
   said analog signal being directly injected into said interferometers by means of a resistor ladder network, and
   circuit means for connecting a gating voltage across said parallel connected interferometers for biasing all of said interferometers, whereby each interferometer for which the bias level exceeds its threshold level will switch from a zero voltage to a voltage state producing an output pulse.

* * * * *